United States Patent
Kang et al.

(10) Patent No.: US 8,513,693 B2
(45) Date of Patent: Aug. 20, 2013

(54) MINIATURE LEADLESS SURFACE MOUNT LAMP WITH DOME AND REFLECTOR CUP

(75) Inventors: Hooi Choo Kang, Penang (MY); Keat Chuan Ng, Penang (MY)

(73) Assignee: Intellectual Discovery Co., Ltd., Seoul (KR)

( * ) Notice: Subject to any disclaimer, the term of this patent is extended or adjusted under 35 U.S.C. 154(b) by 32 days.

(21) Appl. No.: 13/205,396

(22) Filed: Aug. 8, 2011

(65) Prior Publication Data
US 2013/0037837 A1    Feb. 14, 2013

(51) Int. Cl.
*H01L 33/62* (2010.01)

(52) U.S. Cl.
USPC ............. 257/98; 257/88; 257/89; 257/99; 257/666; 257/676; 257/E33.059; 257/E33.061; 257/E33.072; 438/26; 438/27

(58) Field of Classification Search
USPC .......... 257/88, 89, 98, 99, 666, 676, E33.059, 257/E33.061, E33.072; 438/26, 27
See application file for complete search history.

(56) References Cited

U.S. PATENT DOCUMENTS

| 5,130,604 | A | 7/1992 | Franks, Jr. et al. |
| 6,086,225 | A | 7/2000 | Kahl et al. |
| 6,943,433 | B2 * | 9/2005 | Kamada ................ 257/666 |
| 7,655,958 | B2 * | 2/2010 | Sanmyo ................ 257/99 |
| 8,044,418 | B2 * | 10/2011 | Loh et al. ............ 257/98 |
| 8,134,173 | B2 * | 3/2012 | Kamamori et al. ..... 257/99 |
| 2011/0134629 | A1 | 6/2011 | Kim |

OTHER PUBLICATIONS

Pohl, Andreas, "'SMT Lamps': Merging Through-Hole and Surface-Mount LED Technology", ECN, available at http://www.ecnmag.com/Articles/2011/04/App-Solutions/SMT-Lamps/, Apr. 6, 2011, 6 pages.
Avago Technologies, "ASMT-FJ30 Mini Surface Mount AF LED", Data Sheet, AV02-0996EN, Jan. 28, 2008, 6 pages.

* cited by examiner

*Primary Examiner* — Dao H Nguyen
(74) *Attorney, Agent, or Firm* — Fox Rothschild, LLP

(57) ABSTRACT

A package for a light source is disclosed. In particular, a Plastic Leaded Chip Carrier (PLCC) is described which provides many features offered by traditional surface mount technology lamps, but also has a decreased height, increased light output, and enables a smaller viewing angle as compared to traditional surface mount technology lamps.

20 Claims, 9 Drawing Sheets

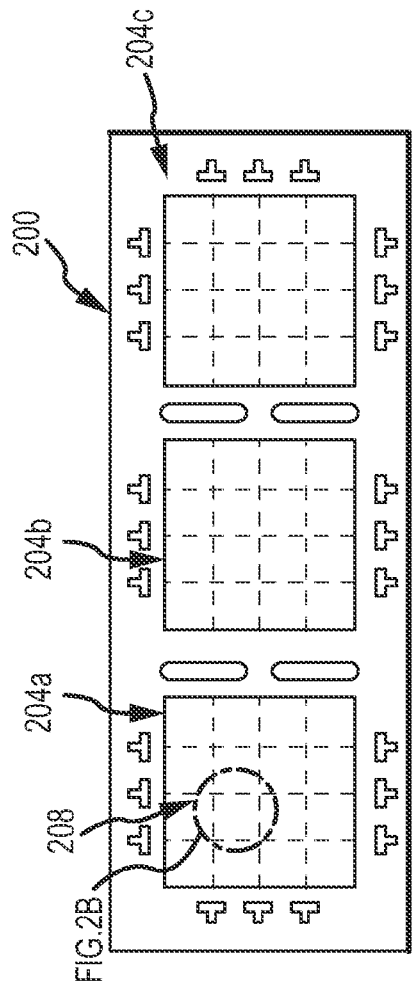
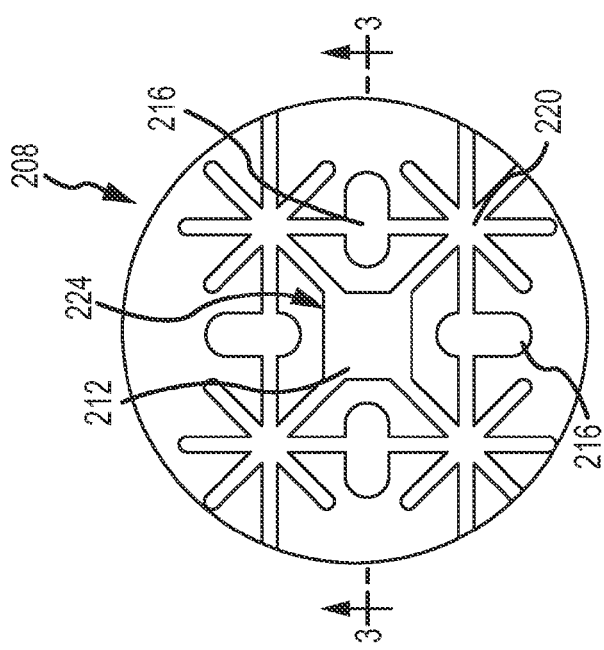

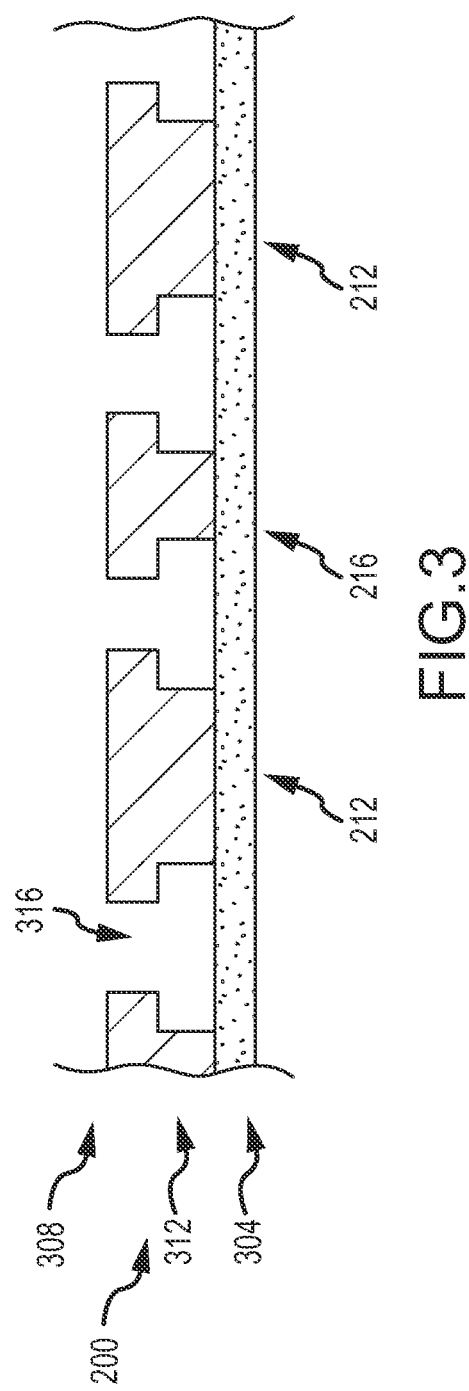

MINIATURE LEADLESS SURFACE MOUNT LAMP WITH DOME AND REFLECTOR CUP

FIELD OF THE DISCLOSURE

The present disclosure is generally directed toward light emitting devices and packages for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

Among the various packages for LEDs, an LED package of interest is the Plastic Leaded Chip Carrier (PLCC) package for a surface mount LED. Surface mount LEDs in PLCC packages may be used, for example, in automotive interior display devices, electronic signs and signals, and electrical equipment.

Most existing PLCC package designs do not include a reflector cup, which means that light emitted by a light source contained within a traditional PLCC package is diffused. This has restrained PLCC packages from being used for white lamps.

Another type of LED package is known as a Surface Mount Technology (SMT) lamp. As compared to a PLCC package, the SMT lamp is larger in overall size and it particularly taller in height. This increased size consumes significantly more board space than the PLCC package counterpart thereby (1) reducing the number of pixels in a board of a specified size and (2) increasing the overall thickness of the board. The SMT lamp, however, is capable of limiting the amount of light that is diffused—especially when compared to a PLCC package. This means that SMT lamps are most often employed in white lamps.

It would be advantageous to design a package for a light source that incorporates the benefits of the PLCC package and the SMT lamp in a single package.

BRIEF DESCRIPTION OF THE DRAWINGS

The present disclosure is described in conjunction with the appended figures:

FIG. 2A is a top view of a bare lead frame in accordance with embodiments of the present disclosure;

FIG. 2B is an exploded view of a portion of the lead frame depicted in FIG. 2A;

FIG. 3 is a cross-sectional view along line 3-3 depicted in FIG. 2B of a first intermediate product in accordance with embodiments of the present disclosure;

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Figure 1:
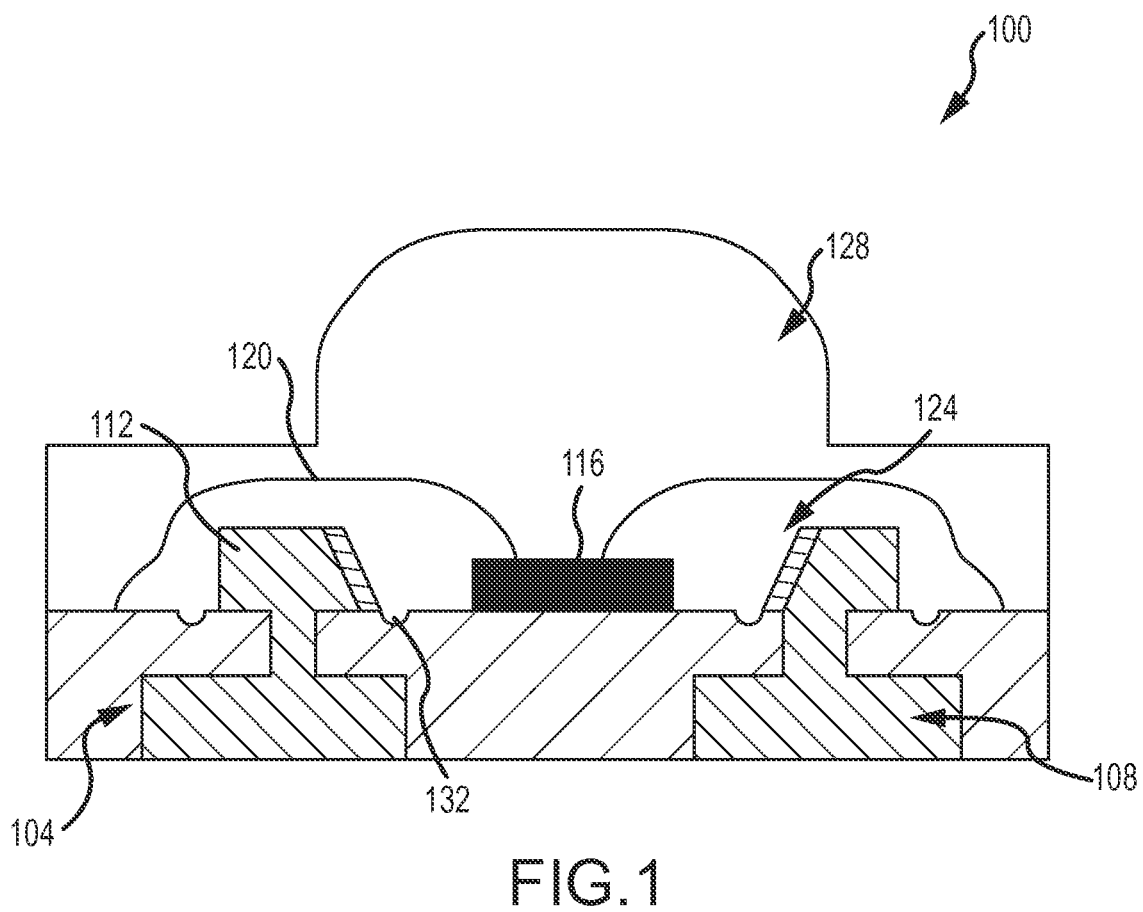
FIG. 1 is a cross-sectional view of a light source package and light source in accordance with embodiments of the present disclosure.

Referring now to FIG. 1, an example of a light source package 100 will be described in accordance with embodiments of the present disclosure. The package 100 depicted and described herein comprises the advantageous small form-factor available in traditional PLCC packages while simultaneously comprising the optical elements which minimize light diffusion, thereby enabling the package to be used for white lamp applications. In some embodiments, the package 100 comprises a lead frame 104 having a plurality of leads separated by a non-conductive mold 108. In some embodiments, the mold 108 may be constructed of any polymer or combination of polymers using extrusion, machining, micro-machining, molding, injection molding, or a combination of such manufacturing techniques. As a non-limiting example, the non-conductive mold 108 may comprise polyphthalamide (PPA). Accordingly, the terms non-conductive mold, PPA, PPA mold, and pre-mold may be used synonymously herein to refer to the element 108 that separates the conductive components of the lead frame 104.

The lead frame 104 may comprise a number of leads that are configured to carry electrical current to and from a light source 116. In some embodiments, the light source 116 is physically connected to a mounting surface of the lead frame 104 and electrically connected to other conductive leads of the lead frame 104. Stated another way, the light source 116 may not be electrically connected to the surface on which it is mounted. In such an embodiment, two or more wires 120 may be connected to the light source 116 and each of the two or more wires 120 may be connected to other leads of the lead frame 104. It may also be possible, however, to electrically connect the light source 116 to a lead on which it is mounted via a conductive adhesive or the like in which case only one wire 120 may be required to connect the light source 116 to another one of the conductive leads.

In the embodiment depicted in FIG. 1, the surface onto which the light source 116 is mounted is not used to carry electrical current to or from the light source 116. Rather, the surface of the lead frame 104 only provides a mounting surface for the light source 116. In this particular non-limiting embodiment, a first end of a first wire 120 is attached (e.g., via soldering, welding, gluing, etc.) at a first point on the top surface of the light source 116. A second end of the first wire 120 is then attached to another lead (e.g., via soldering, welding, gluing, etc.). The creation of an electrical potential between the light source 116 and the other lead (e.g., a first conductive lead) to which the first wire 120 is attached causes electrical current to flow to or from the light source 116 via the first wire 120.

Continuing the above example, a first end of a second wire 120 is also attached to the top surface of the light source 116, but at a second point (different from the first point) on the top surface of the light source 116. A second end of the second wire 120 is then attached to yet another lead (e.g., a second conductive lead). The creation of an electrical potential between the light source 116 and the second conductive lead causes electrical current to flow to or from the light source 116 via the second wire 120. Accordingly, an electrical circuit is created between the two conductive leads and the light source 116 when an electrical potential is created between the two conductive leads.

The light source 116, in some embodiments, comprises an LED or array of LEDs. Where an LED or similar light source is used, one of the bonding wires 120 is connected to an anode of the light source 116 whereas another of the bonding wires 120 is connected to a cathode of the light source 116. In some embodiments, the anode and cathode are both on the top light-emitting surface of the light source 116. In some embodiments, the anode and cathode are on opposite surfaces of the light source 116. Such a light source 116 may be constructed using known flip-chip manufacturing processes or any other known method for establishing both an anode and cathode on a common side of a light source 116. In either configuration, by connecting the anode and cathode of the light source 116 to two different conductive leads, an electrical potential can be applied to the anode and cathode of the light source 116 thereby energizing the light source 116 and causing it to emit light. In some embodiments, the light source 116 is configured to emit light from its top surface (e.g., away from the lead frame 104) when energized. Other suitable light sources include, without limitation, a laser diode, an array of laser diodes, or a combination of laser diodes and LEDs.

In some embodiments, the non-conductive mold 108, which electrically separates the various leads of the lead frame 104, may comprise a reflector cup 112. The reflector cup 112 may be formed in a top portion of the non-conductive mold 108. In some embodiments, the reflector cup 112 encloses the surface of the lead frame 104 onto which the light source 116 is mounted, but does not enclose the conductive leads of the lead frame 104. Accordingly, when the light source 116 is mounted within the reflector cup 112, it may be necessary to have each of the bonding wires 120 extend over the top of the reflector cup 112. It should be appreciated that the reflector cup 112 may be formed in any uniform or non-uniform shape (e.g., circular, elliptical, trapezoidal, square, rectangular, triangular, etc.) depending upon the desired light distribution. In some embodiments, the area of the reflector cup 112 is larger its top surface as compared to its bottom surface. This means that the reflector cup 112 gets larger as it extends away from the light source 116. In some embodiments, the top surface of the reflector cup 112 extends above the top surface of the light source 116.

In some embodiments, the inner surface of the reflector cup 112 is coated with a reflective material. Specifically, since the reflector cup 112 is composed of same material as the non-conductive mold 108, it may be necessary to increase the reflectivity of the reflector cup 112 to improve the optical performance of the package 100. In some embodiments, the inner surface of the reflector cup 112 is coated with a reflective material such as tin, aluminum, etc. to increase the reflectivity of the reflector cup 112. The reflective material may be deposited in the reflector cup via any known deposition process such as electroplating, ALD, CVD, magnetron sputtering, and the like.

In some embodiments, the lead frame 104 may comprise a number of notches 132 on the conductive leads and/or mounting surface. The notches 132 may comprise etchings on the top surface of the lead frame 104 which prevent the non-conductive mold 108 from flowing into active areas of the lead frame 104.

The package 100 may also comprise an encapsulant 124 that is configured to encapsulate the light source 116 and bonding wires 120 onto the lead frame 104. Any number of materials may be suitable for use as the encapsulant 124. Examples of such materials include, without limitation, epoxy, silicone, a hybrid of silicone and epoxy, phosphor, a hybrid of phosphor and silicone, an amorphous polyamide resin or fluorocarbon, glass, plastic, or combinations thereof. Furthermore, the encapsulant 124 may be formed to have one or more light-shaping elements 128 incorporated therein. Specifically, the encapsulant 124 can be formed to have one or more curved surfaces which shape the light emitted by the light source 116 in a desired pattern. As a non-limiting example, the light-shaping element 128 may comprise a dome, a curved surface, a series of curved surfaces, or any other type of surface for directing light in a predetermined pattern. Accordingly, the encapsulant 124 can serve multiple purposes of (1) protecting the light source 116 and/or bonding wires 120 from physical damage, (2) hermetically sealing the light source 116 and/or bonding wires 120, and/or (3) shaping light emitted by the light source 116.

With reference now to FIGS. 2A through 10, a method of manufacturing a package 100 and the intermediate products obtained thereby will be described in accordance with embodiments of the present disclosure. The manufacturing process begins when a bare lead frame 200 is received (step 1004). FIGS. 2A and 2B depict a suitable example of a bare lead frame 200 that can be utilized. In some embodiments, the bare lead frame 200 is constructed of a conductive material such as a metal, metal alloy, or composite. The bare lead frame 200 may comprise a plurality of sections 204a, 204b, 204c, each of which comprise a plurality of units 208. The individual units 208 will eventually be separated from one another to create a plurality of packages 100 from the bare lead frame 200. Although the bare lead frame 200 is depicted as comprising three sections 204a, 204b, 204c, it should be appreciated that a bare lead frame 200 may comprise a greater or lesser number of sections without departing from the scope of the present disclosure.

FIG. 2B depicts additional details of an individual unit 208. In particular, each unit 208 may comprise an attach pad 212, a plurality of lead fingers 216, and a plurality of tie bars 220 connecting the attach pad 212 to the plurality of lead fingers 216. In some embodiments, the attach pad 212 corresponds to an area of the unit 208 onto which a light source 116 may eventually be mounted. Each of the lead fingers 216 may correspond to areas which will eventually become conductive leads for the package 100.

As can be seen in FIG. 2B, a single attach pad 212 may be surrounded by the plurality of lead fingers 216 and each of the plurality of lead fingers 216 may not only be positioned between different attach pads 212, but they may also extend from both sides of a tie bar 220. Accordingly, a single lead finger 216 may be separated into two different conductive leads of two different packages 100 once the units 208 have been singulated by cutting the tie bars 220. By allowing a single lead finger 216 to eventually be separated into two different conductive leads, the utilization of space on the bare lead frame 200 is maximized and material costs are minimized. Therefore, a useful configuration of a single unit 208 will comprise a single attach pad 212 surrounded substantially uniformly by four lead fingers 216. As a non-limiting example, each of the four lead fingers 216 may be separated from the attach pad 212 by substantially the same distance (e.g., within a machining tolerance) and may be distributed at 90 degree increments around the attach pad 212. It should be appreciated, however, that an attach pad 212 can be surrounded by a greater or lesser number of lead fingers 216 (uniformly or non-uniformly) without departing from the scope of the present disclosure.

Although the attach pad 212 is depicted as having generally square dimensions and the lead fingers 216 are depicted as having generally elliptical dimensions, it should be appreciated that the attach pads 212 and lead fingers 216 may be formed in any number of shapes without departing from the scope of the present disclosure. For instance, the attach pads 212 and lead fingers 216 may be generally circular in shape.

In some embodiments, one or more of the attach pads 212 may comprise a notch 224 on a single side thereof. The notch 224 can be used as an orientation indicator during the manufacturing process of the package 100. In particular, the notch 224 can be referenced during various manufacturing stages to ensure that the appropriate manufacturing steps are being performed on the appropriate portions of the bare lead frame 200.

The manufacture of the package 100 continues when a tape 304 is applied to a selected surface of the bare lead frame 200 (step 1008). In some embodiments, the tape 304 may correspond to a thermally-stable adhesive tape that is adhered to a bottom surface of the bare lead frame 200.

The cross-sectional view depicted in FIG. 3 also shows additional features of the bare lead frame 200. Specifically, the cross-sectional characteristics of the attach pads 212 and lead fingers 216 are shown in more detail. In some embodiments, the bare lead frame 200 may comprise a half-etched frame to facilitate stable anchoring of the non-conductive mold 108 to the lead frame 104. More particularly, a top section 308 of the bare lead frame 200 may not be etched whereas a bottom section 312 of the bare lead frame 200 is etched. This causes a gap 316 between the attach pad 212 and lead finger 216 to have a t-shaped cross-section. Even more specifically, the width of the gap 316 in the bottom section 312 of the bare lead frame 200 may be larger than the width of the gap 316 in the top section 308 of the bare lead frame 200. This t-shaped cross-section facilitates the stable anchoring of the non-conductive mold 108 to the lead frame 104 in the finished package 100. In some embodiments, the top section 308 and bottom section 312 are of substantially the same thickness (e.g., within a machining tolerance) such that the top section 308 represent the top half of the bare lead frame 200 and the bottom section 312 represents the bottom half of the bare lead frame 200. Such a configuration is not required, however. In some embodiments, the top section 308 may be thicker than the bottom section 312 or the bottom section 312 may be thicker than the top section 308. Even more particularly, and as a non-limiting example, the total thickness of the bare lead frame 200 may be between about 0.1 mm and 0.3 mm and in some embodiments may be about 0.2 mm.

Figure 4A:
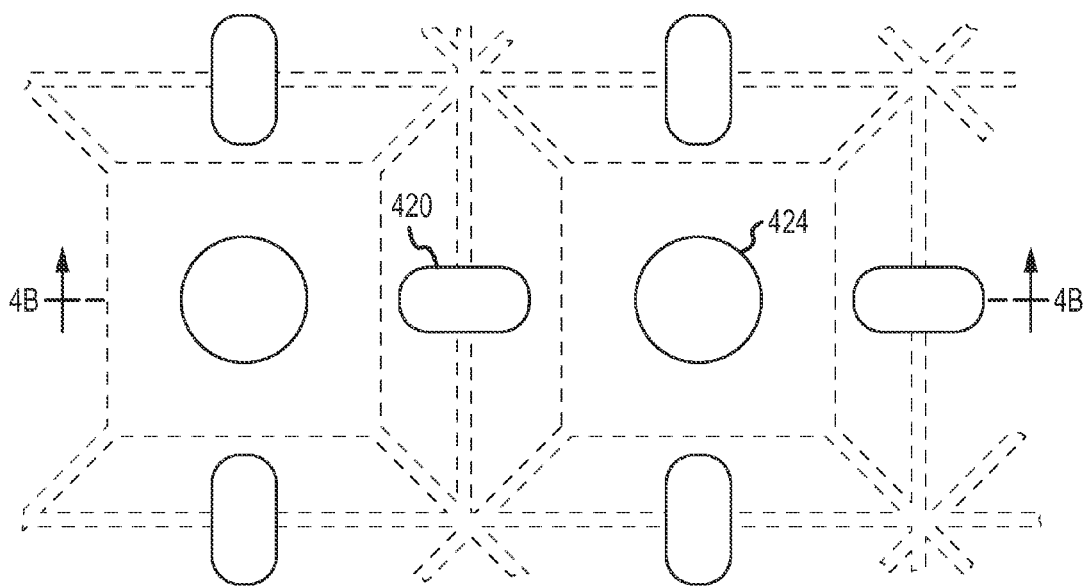
FIG. 4A is a top view of a second intermediate product in accordance with embodiments of the present disclosure.
Figure 4B:
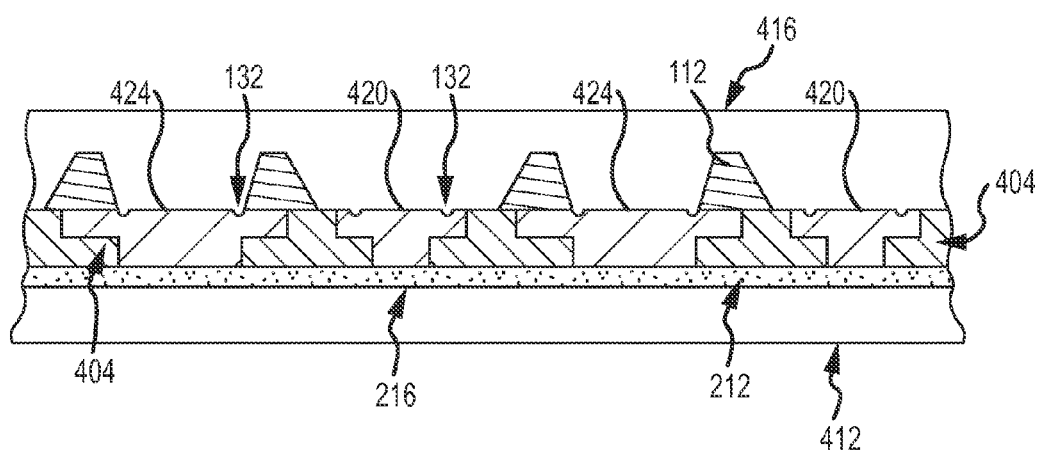
FIG. 4B is a cross-sectional view along line 4-4 depicted in FIG. 4A.

Referring back to FIG. 10, after the tape 304 has been attached to the bare lead frame 200, the process continues by molding the non-conductive mold 404 around the bare lead frame 200 (step 1012). An intermediate product obtained by this process step is depicted in FIGS. 4A and 4B.

The non-conductive mold 404 may be the same or identical to the non-conductive mold 108 except that it is not singulated. The same statement is true with respect to the bare lead frame 200 and lead frame 104.

In some embodiments, this step is completed by placing the bare lead frame 200 having the tape 304 attached thereto into a transfer mold system. Specifically, the bare lead frame 200 and tape 304 may be placed between a bottom die set 412 and a top die set 416 of a transfer mold system. The bottom die set 412 may comprise a generally flat surface that interfaces with the tape 304. The top die set 416, however, may comprise a number of features or indentations on the surface that interfaces with the top surface of the bare lead frame 200. The features or indentations in the top die set 416 may be positioned relative to the bare lead frame 200 to establish the reflector cups 112 of the non-conductive mold 404 around each attach pad 212. Specifically, the features or indentations in the top die set 416 may be positioned proximate to notches 132 that are established on the top surfaces 420 of the lead fingers 216 and the top surfaces 424 of the attach pads 212. The features or indentations in the top die set 416 along with the notches 132 substantially inhibit the non-conductive mold 404 from covering the entire top surface of either the attach pad 212 or lead finger 216.

In accordance with at least some embodiments of the present disclosure, the entirety of the top surface 420 of each lead finger 216 is left exposed (e.g., not covered with the non-conductive mold 404). On the other hand, a portion of the top surface 424 of the attach pad 212 is covered with the non-conductive mold 404. Particularly, the portion of the top surface 424 of the attach pad 212 is covered with the non-conductive mold 404 to establish the reflector cups 112 around each attach pad 212. In some embodiments, the remaining area of the attach pad 212 that is left exposed is completely enclosed by the reflector cup 112. The still-exposed area of the attach pad 212 may be substantially circular or may have any other suitable shape.

In some embodiments, the height of the reflector cup 112 may be substantially similar to the thickness of the bare lead frame 200. Accordingly, as a non-limiting example, the reflector cup 112 may be between about 0.1 mm and 0.3 mm in height and in some embodiments may be about 0.2 mm in height.

After the non-conductive mold 404 is established about the bare lead frame 200, the manufacturing process continues by attaching a light source 116 to the top surface 424 of each attach pad 212 and also by connecting bonding wires 120 between the light source 116 and the top surface 420 of the lead fingers 216 (step 1016). In this step, a light source 116 may be glued, soldered, welded, or otherwise physically connected to the top surface 424 of an attach pad 212 that is still exposed and within the reflector cup 112.

Then, depending upon the nature of the light source 116 (e.g., depending upon whether both the anode and cathode are on the top surface of the light source 116 or whether both of the anode and cathode are on the bottom surface of the light source 116, which is connected to the attach pad 212), one or more bonding wires 120 are connected between the light source 116 and a lead finger 216 that is outside the reflector cup 112. Accordingly, it may be required to loop one or more of the bonding wires 120 over the reflector cup before or after it has been attached to the light source 116 and/or lead finger 216. In some embodiments, the bonding wires 120 may comprise a cross-sectional profile that is one of square, rectangular, and circular.

Figure 5:
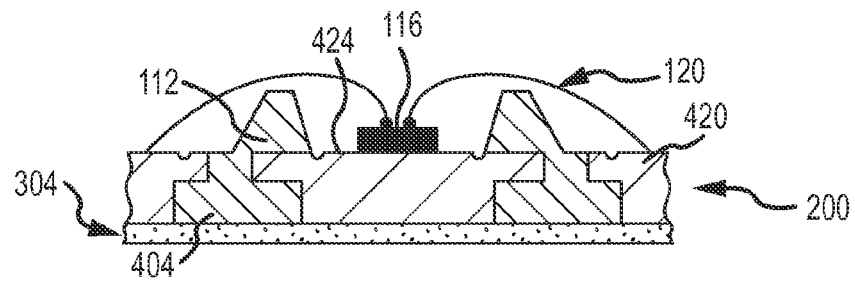
FIG. 5 is a cross-sectional view of a third intermediate product in accordance with embodiments of the present disclosure.

FIG. 5 depicts one embodiment of an intermediate product obtained by step 1016 where the bonding wire 120 is looped over a fully-formed reflector cup 112. In this embodiment, the bonding wire 120 may comprise a loop height of between about 10 mils and 15 mils and in some embodiments the bonding wire 120 comprises a loop height of about 12 mils (e.g., about 0.3048 mm).

Figure 6A:
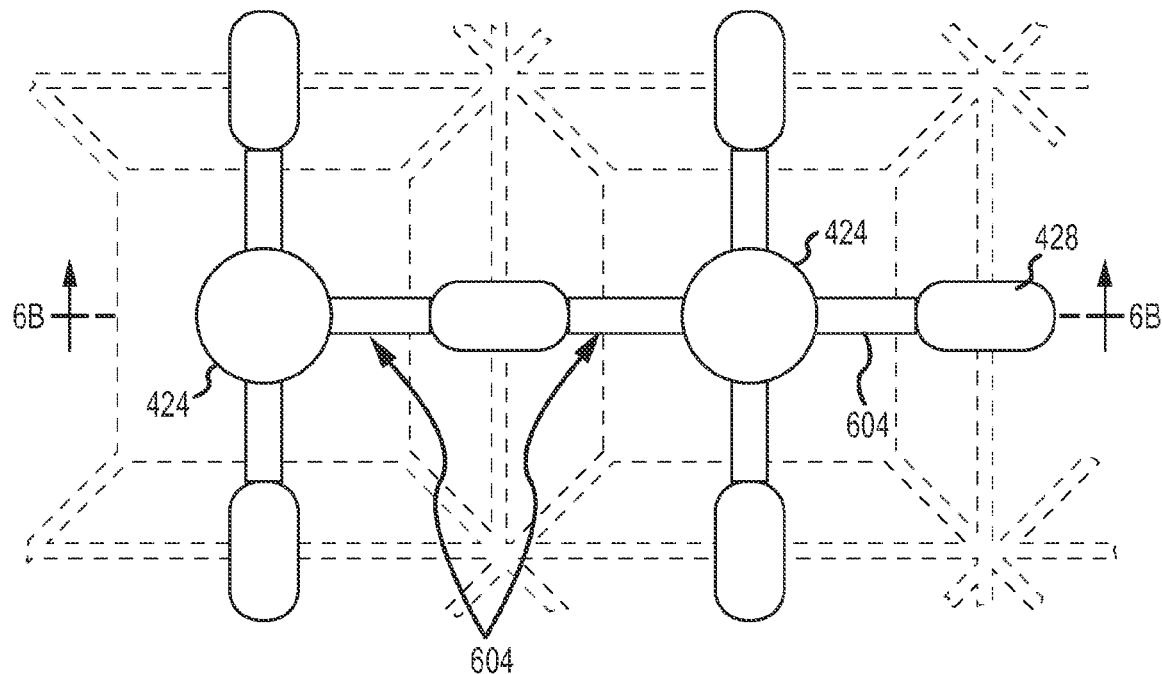
FIG. 6A is a top view of a fourth intermediate product in accordance with embodiments of the present disclosure.
Figure 6B:
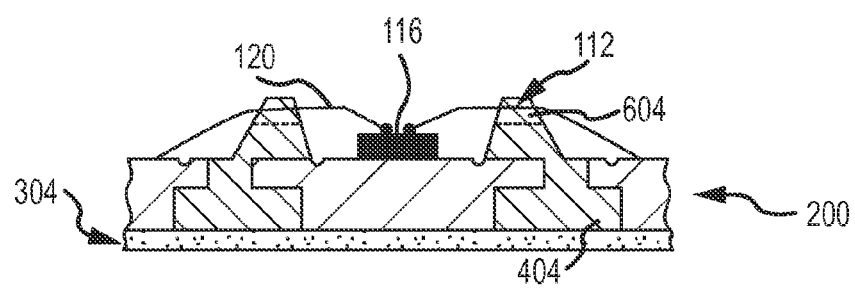
FIG. 6B is a cross-sectional view along line 6-6 depicted in FIG. 6A.

FIGS. 6A and 6B depict another embodiment of an intermediate product obtained by step 1016 where the reflector cup 112 formed in the non-conductive mold 404 comprises one or more recesses 604 in its top surface. In some embodiments, a recess 604 is established directly between the attach pad 112 and one of the lead finger 216. In some embodiments, a first recess 604 is established between the attach pad 112 and one of the adjacent lead fingers 216 while a second recess 604 is established between the attach pad 112 and another of the adjacent lead fingers 216. In some embodiments, a separate recess is established between the attach pad 112 and each of the adjacent lead fingers 216.

In any of the above embodiments, the depth of the recess 604 may be in substantially the same plane as the top surface of the light source 116. Alternatively, one or more of the recesses 604 can still be higher than the top surface of the light source 116. Still further in the alternative, one or more of the recesses 604 can be below the top surface of the light source 116.

As compared to the embodiment of FIG. 5, the one or more recesses 604 make it possible to lower the loop height of the bonding wires 120 that traverse the reflector cup 112. Thus, the bonding wire 120 can travel a more direct path from the light source 116 to the lead finger 216. In some embodiments, it may be possible to reduce the wire loop height to about 6 mils or less. It may not be preferable, however, to utilize the one or more recesses 604 where precise light radiation patterns are required of the package 100.

Once the light sources 116 have been attached to the bare lead frame 200 and the bonding wires 120 have been appropriately connected, the manufacturing process may continue with an encapsulation step. However, there are a number of possible ways to encapsulate the intermediate product of FIG. 5 or FIGS. 6A and 6B. Specifically, either a casting process or a transfer mold process can be performed to achieve the encapsulation step. Accordingly, the method proceeds by first determining whether the encapsulation step will be done via casting or via a transfer mold process (step 1020).

Figure 7A:
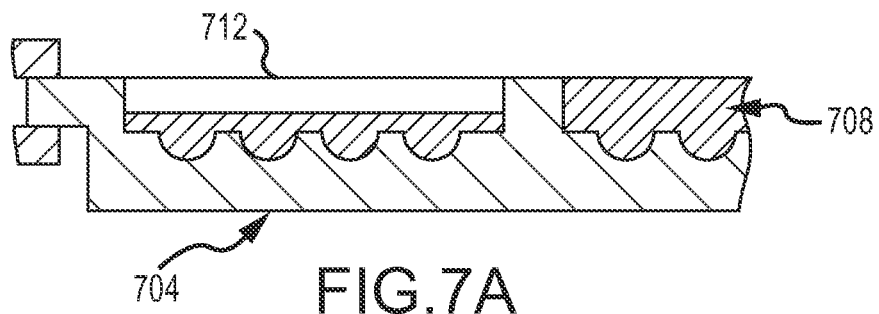
FIG. 7A is a cross-sectional view of lead frame having encapsulation cast molded thereto in accordance with embodiments of the present disclosure.
Figure 7B:
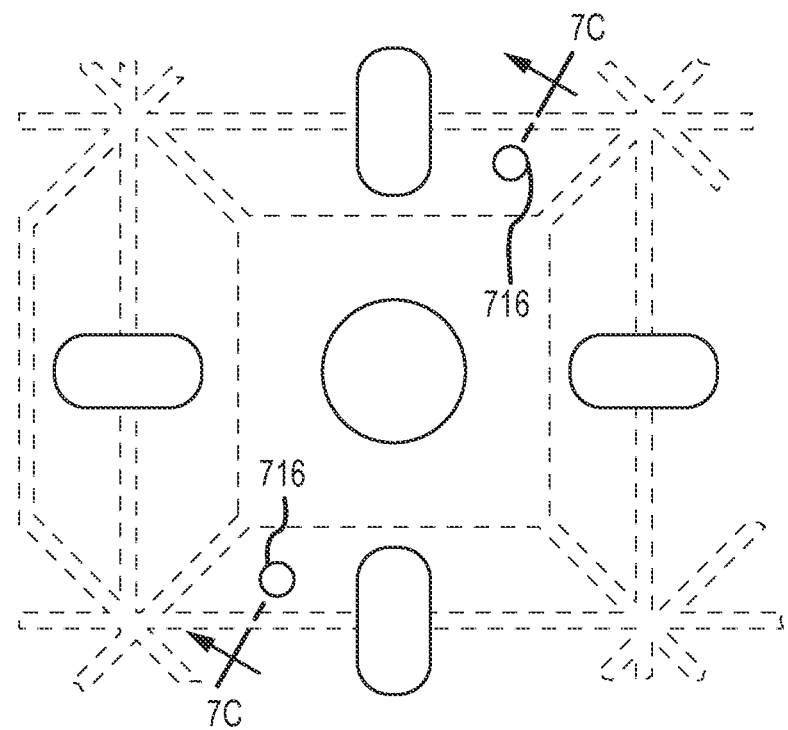
FIG. 7B is a top view of a fifth intermediate product in accordance with embodiments of the present disclosure.
Figure 7C:
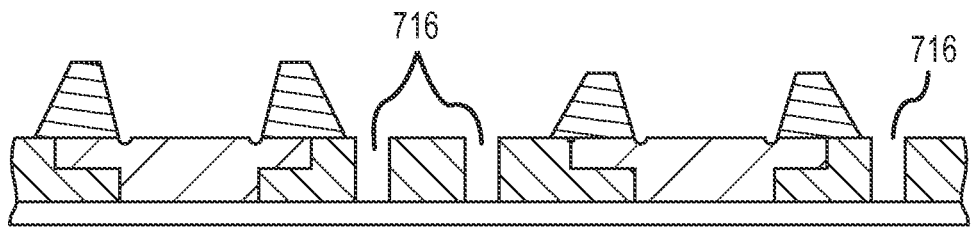
FIG. 7C is a cross-sectional view along line 7-7 depicted in FIG. 7B.

FIGS. 7A-C depict aspects of the encapsulation step via the casting process. Specifically, if a casting process is to be employed, then the intermediate product obtained after step 1016 is pre-dipped in the reflector cup 112 with a first encapsulant and the encapsulant is partially cured (step 1024). In particular, the first encapsulant can be pre-dipped onto the reflector cup 112 with any dispensing method using time pressure, auger, piston pumps or jet technology, etc. The dispensing of the first encapsulant is to fill up the cavity of the reflector cup 112 allowing the air to escape within the cavity of the reflector cup 112 before the intermediate product 712 is fully encapsulated with second encapsulant 708 in the subsequent process (step 1032). This pre-dipping and partial cure also causes the light source 116 and bonding wires 120 to be more securely fixed to the bare lead frame 200. Thereafter, the tape 304 is removed from the bottom surface of the bare lead frame 200 (step 1028) and a casting process is performed (step 1032). Detape (step 1028) is to remove the tape on the encapsulant 404 where the tape is covering the exit of the air vent 716. The air within the cavity of the frame mold cup 704 may escape via the open-end air vents 716 when the second encapsulant 708 occupying the space of the cavity in the frame mold cup 704.

FIG. 7A depicts the intermediate product 712 during the casting process where the intermediate product 712 is placed within a frame mold cup 704 and the encapsulant 708 is supplied to the cavity of the frame mold cup 704. Similar to the bare lead frame 200 and non-conductive mold 404, the encapsulant 708 may be similar or identical to encapsulant 124 except that it is not yet singulated.

As can be seen in FIG. 7A, since the bare lead frame 200 comprises a plurality of units 208, the frame mold cup 704 may comprise a corresponding number of features that form the light-shaping element 128 for each package 100.

Referring to FIGS. 7A and 7B, it should also be noted that for the casting process, one or more air vents 716 may be established in the non-conductive mold 404 in each unit 208. Specifically, the air vents 716 may be provided to allow the release of air that is trapped during the casting process. The air vents 716 may be positioned anywhere within the non-conductive mold 404 between the attach pad 212 and the tie bars 220. It may be preferable not to position the air vents 716 directly between the attach pad 212 and lead finger 216, especially since the reflector cup 112 is positioned between the attach pad 212 and lead finger 216. It should be appreciated that each unit 208 may have one, two, three, four, or more air vents 716. It should also be appreciated that each unit 208 may not necessarily require its own air vent 716 as long as a suitable number of air vents 716 are distributed about the entirety of the non-conductive mold 404.

Figure 9A:
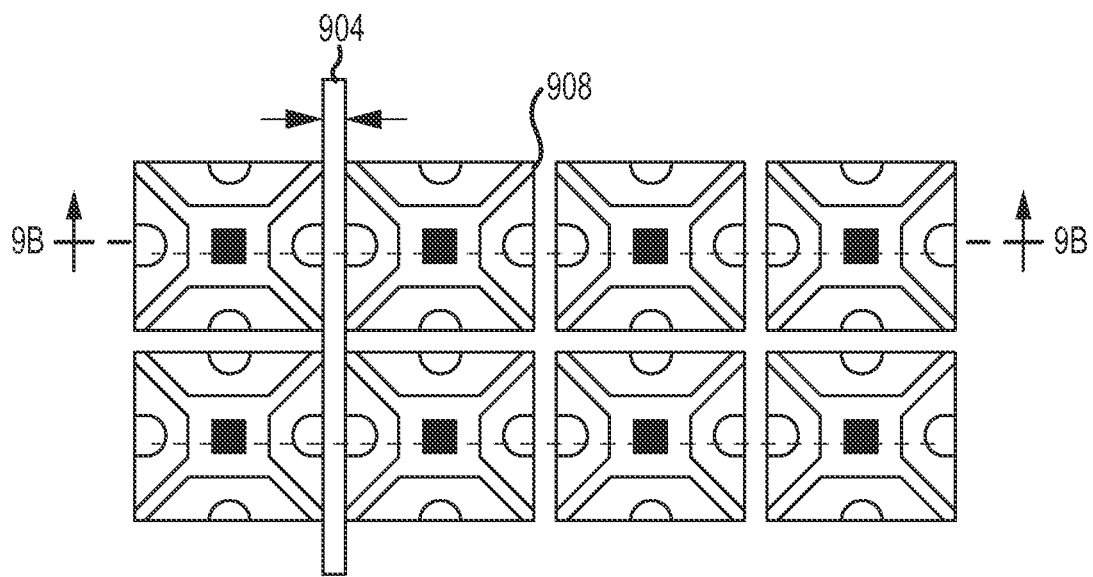
FIG. 9A is a top view of a sixth intermediate product in accordance with embodiments of the present disclosure.
Figure 9B:
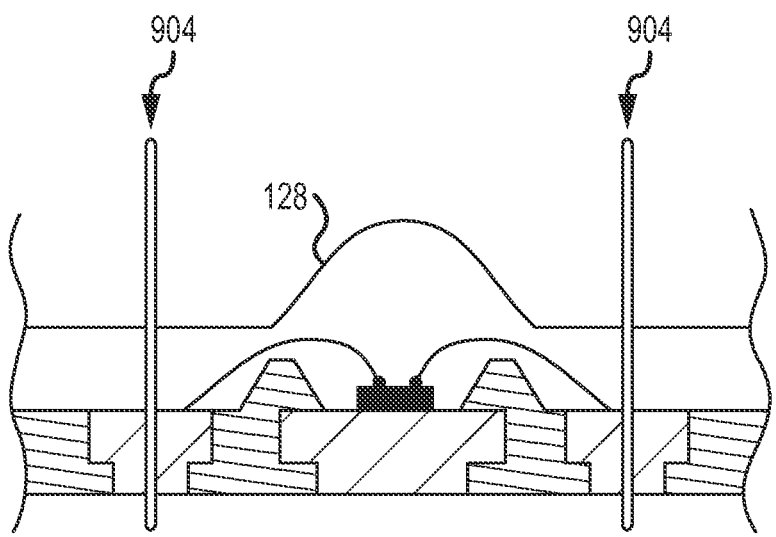
FIG. 9B is a cross-sectional view along line 9-9 depicted in FIG. 9A.
Figure 10:
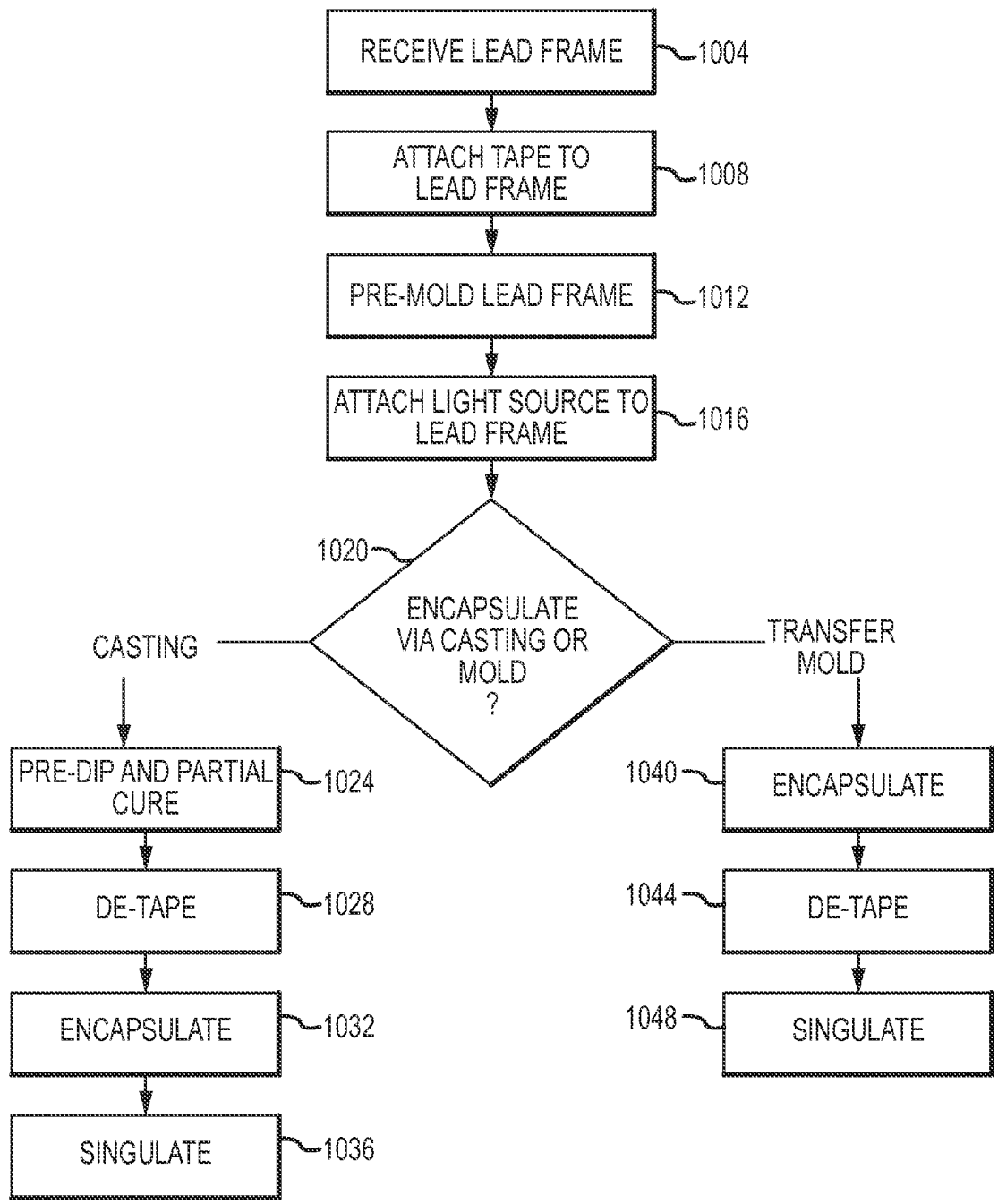
FIG. 10 is a flow diagram depicting a package manufacturing process in accordance with embodiments of the present disclosure.

Once the casting process is completed, the separate packages 100 are created by separating the units 208 in a singulation process (step 1036). FIGS. 9A and 9B depict additional details of the singulation process. In particular, the singulation process is the process whereby each of the units 208 are separated from one another and a plurality of discrete packages 100 are obtained thereby. More specifically, during the singulation process, a saw blade 904 or similar cutting apparatus is used to cut through the tie bars 220 connecting each of the lead fingers 216. As can be seen in FIG. 9A, the saw blade 904 may comprise a thickness that is substantially identical to a thickness of the tie bars 220 at their thickest part. Furthermore, the saw blade 904 may cut into the intermediate product such that each of the lead fingers 216 are cut in half and the attach pad 212 is electrically isolated from all of the lead fingers 216. Thus, a separation gap 908 may be created between each of the units 208 and the final package 100 can be achieved.

Figure 8:
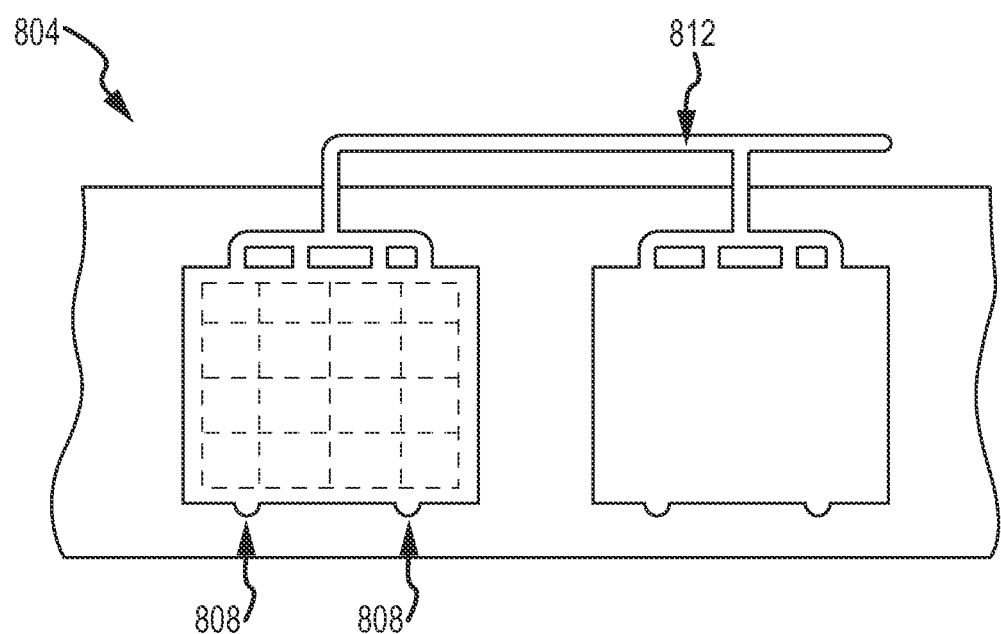
FIG. 8 is a schematic diagram of a transfer molding system in accordance with embodiments of the present disclosure.

Referring back to step 1020, if the encapsulation will be performed via a transfer mold process, then the method continues by first performing the transfer mold process to secure the encapsulant 708 to the intermediate product 712 (step 1040). As can be seen in FIG. 8, the transfer molding process may utilize a transfer mold system 804 that includes a mold having a plurality of air vents 808 therein and a mold feeder or runner 812. The material of the encapsulant 708 may be fed into the transfer mold via the mold runner 812 and the air from within the cavity of the transfer mold may escape via the air vents 808 due to the encapsulant 708 occupying the space of the cavity in the transfer mold. After the encapsulant 708 has been completely injected via the transfer mold process, the method continues with the removal of the tape 304 (step 1044) and then singulation of the individual units 208 (step 1048). The singulation step 1048 may be similar or identical to the singulation step 1036.

After the individual packages 100 have been obtained, the method may continue by preparing the packages 100 for sale (either individually or in bulk).

Advantages obtained by employing the embodiments discussed herein are many. In particular, a package 100 can be manufactured that achieves an increased light output, enables a smaller viewing angle, and enables white lamps that are compatible with the PLCC standard. Furthermore, multiple dice can be packaged simultaneously either within a single package 100 or across a plurality of packages 100. Further still, a package 100 with the above qualities can be achieved while also having a smaller form-factor than previous SMT lamps. The package 100 also provides a direct thermal path to the circuit board onto which the package 100 is mounted (e.g., thermal path via the attach pad 212 of the lead frame 104). Also, the manufacturing process described herein leverages chip LED processing techniques, thereby minimizing the capital investment required to produce the package 100 described herein.

Specific details were given in the description to provide a thorough understanding of the embodiments. However, it will be understood by one of ordinary skill in the art that the embodiments may be practiced without these specific details. For example, circuits may be shown in block diagrams without unnecessary detail in order not to obscure the embodiments. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical device, comprising:
    a lead frame comprising an attach pad, a first conductive lead, and a second conductive lead;
    a non-conductive mold that physically separates the attach pad from both the first conductive lead and the second conductive lead, wherein the non-conductive mold also comprises a reflector cup that encloses the attach pad and is positioned between the attach pad and both the first conductive lead and the second conductive lead such that the first and second conductive leads are not within the reflector cup;
    a light source mounted to the attach pad;
    a first bonding wire connecting the light source to the first conductive lead; and
    a second bonding wire connecting the light source to the second conductive lead.

2. The device of claim 1, further comprising an encapsulant that is attached to a top surface of the lead frame and encapsulates the light source, the first bonding wire, and the second bonding wire.

3. The device of claim 2, wherein the encapsulant comprises a light-shaping element that includes at least one curved surface.

4. The device of claim 1, wherein the first bonding wire connects the light source to the first conductive lead by extending over an edge of the reflector cup from outside of the reflector cup.

5. The device of claim 4, wherein the second bonding wire connects the light source to the second conductive lead by extending over an edge of the reflector cup from outside of the reflector cup.

6. The device of claim 5, wherein the first and second leads are substantially equidistance from the attach pad.

7. The device of claim 4, wherein the edge of the reflector cup comprises a recess in its top surface that is positioned between the attach pad and the first conductive lead and wherein the first bonding wire passes through the recess.

8. The device of claim 1, wherein a gap between the attach pad and the first conductive lead comprises a bottom section and a top section, wherein the non-conductive mold substantially fills the gap, and wherein the bottom section is wider than the top section.

9. The device of claim 1, wherein the light source comprises at least one Light Emitting Diode.

10. The device of claim 1, wherein the first conductive lead is exposed on a first side of the non-conductive mold, wherein the second conductive lead is exposed on a second side of the non-conductive mold, and wherein the first and second conductive leads are configured for surface mounting to a circuit board.

11. A package for a light source, comprising:
    a non-conductive mold substantially surrounding an attach pad that is configured to receive a light source and further including a reflector cup that also surrounds the attach pad and extends above a top surface of the attach pad;
    a first conductive lead positioned completely outside of the reflector cup on a first outer side surface of the non-conductive mold; and
    a second conductive lead positioned completely outside of the reflector cup on a second outer side surface of the non-conductive mold.

12. The package of claim 11, wherein the first and second conductive leads are positioned external to the reflector cup such that the first and second conductive leads are not within the reflector cup.

13. The package of claim 12, further comprising an encapsulant that covers a top surface of the first conductive lead, a top surface of the second conductive lead, the reflector cup, and the attach pad.

14. The package of claim 12, further comprising a light source attached to the attach pad.

15. The package of claim 14, wherein the attach pad does not carry current to or from the light source and wherein the attach pad extends to a bottom surface of the package and is configured to dissipate heat generated from the light source toward the bottom surface of the package.

16. The package of claim 11, wherein the light source is connected to the first conductive lead by a first bonding wire and wherein the light source is connected to the second conductive lead by a second bonding wire.

17. The package of claim 16, wherein the first and second bonding wires extend over an edge of the reflector cup from outside of the reflector cup and wherein the reflector cup comprises a reflective material on an inner surface of the reflector cup.

18. A method, comprising:
    receiving a lead frame that comprises a plurality of attach pads and a plurality of lead fingers, the plurality of attach pads and lead fingers being connected by a series of tie bars;
    forming a non-conductive mold around at least a portion of the lead frame such that reflector cups are established around at least some of the attach pads and both of the first and second conductive leads are positioned completely outside of the reflector cup; and performing a singulation processes where at least some of the tie bars are removed thereby electrically isolating the attach pads from the lead fingers.

19. The method of claim 18, wherein the singulation process cuts each of the lead fingers in half.

20. The method of claim 18, wherein the attach pads are separated from the lead fingers by the reflector cups.

\* \* \* \* \*